Dec. 10, 1963

W. O. BERGE 3,114,056

DRIVER CIRCUIT USING AVALANCHE TRANSISTORS AND RESONANT LC FOR RESPECTIVELY DISCHARGING AND RECHARGING OF CAPACITOR

Filed Aug. 22, 1961

INVENTOR

WILLIAM O. BERGE

BY Griffin and Stokes

ATTORNEYS

United States Patent Office 3,114,056
Patented Dec. 10, 1963

3,114,056

DRIVER CIRCUIT USING AVALANCHE TRANSISTORS AND RESONANT LC FOR RESPECTIVELY DISCHARGING AND RECHARGING OF CAPACITOR

William O. Berge, Minneapolis, Minn., assignor to Sperry Rand Corporation, New York, N.Y., a corporation of Delaware Filed Aug. 22, 1961, Ser. No. 133,153
21 Claims. (Cl. 307—88.5)

The present invention relates to a driver circuit, and more particularly, to one capable of generating pulses at a high repetition rate.

The desire for high speed computing machinery of the digital type has created the need for pulse type circuitry capable of a rapid recovery to generate pulses at a high repetition rate. One of the many different types of circuits required in a complex system of the type described above is the driver circuit which, upon receipt of an input pulse, generates an output pulse of substantial current which is used to switch magnetic core memories or the like. A common method of producing a high current pulse has been the use of a resistor-capacitor circuit wherein the capacitor is charged to a predetermined voltage during the quiescent state of the circuit, after which it is rapidly discharged through an output load upon application of a trigger pulse. However, the repetition rate of this basic pulse generating circuit is limited by the finite time required for the capacitor to recharge to its predetermined magnitude during the interval between trigger pulses.

The present invention provides a driver circuit capable of an extremely high repetition rate which includes means for rapidly recharging the capacitor between input trigger pulses. This function is obtained by including an inductance in circuit with the capacitor to provide resonant charging thereof.

It is therefore an object of the present invention to provide a driver circuit having an extremely high repetition rate due to resonant recharging of a capacitor.

Another factor limiting the repetition rate of a capacitor driver circuit is the response time of the switch used to initiate discharging of the capacitor upon application of the input trigger pulse. The advent of transistors has provided the art with many types of solid state switches which act to open and close circuit connections at high speed. Among such devices are those exhibiting the well known negative resistance characteristic, such as point contact transistors, hook collector transistors, and certain types of junction diodes and junction transistors. In the last mentioned device, the negative resistance characteristic is often attributable to avalanche breakdown of the back biased collector-base junction due to the collector voltage being raised to a value exceeding the normal breakdown potential. This effect is evidenced by a sharp increase in collector current with a decrease in collector voltage. The transition of a device to and from its negative resistance region, especially if this characteristic is caused by avalanche breakdown, is extremely rapid. The present invention is particularly adapted for use in a driver circuit which includes a solid state switch of this type.

Another object of the present invention therefore is to provide a high speed driver circuit utilizing the negative resistance characteristic of a solid state device coupled with resonant charging of a capacitor.

These and other objects of the present invention will become apparent during the course of the following description, which is to be taken in conjunction with the drawings, in which.

Figure 1:
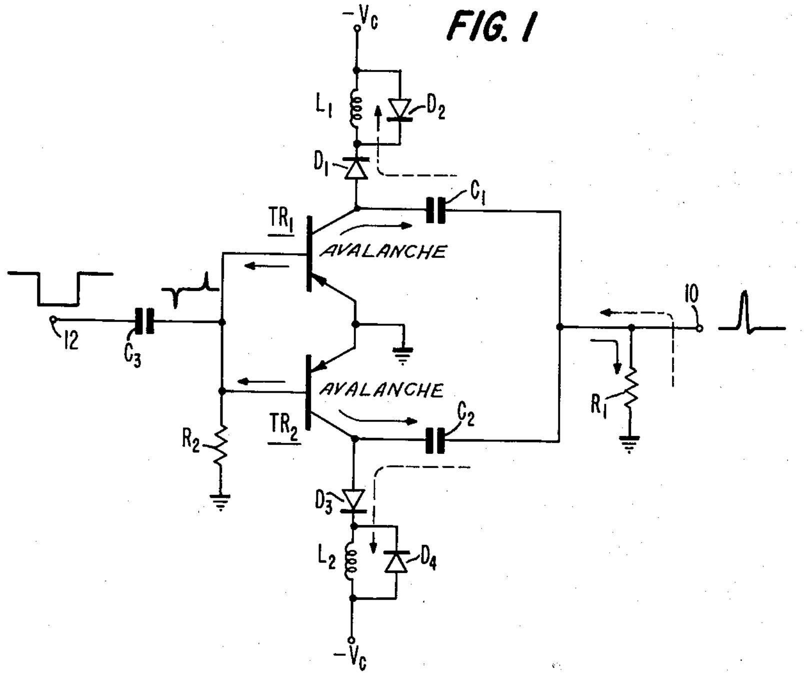
FIGURE 1 is a circuit schematic of one embodiment of the present invention.

FIGURE 1 shows one embodiment of the present invention wherein a plurality of PNP junction transistors are paralleled to provide a high current output. PNP transistors TR1 and TR2 have their emitter electrodes connected to a point of reference potential, such as ground, with their base electrodes being connected through a resistor $R_2$ to the same reference ground potential. The collector electrodes of the transistors are respectively connected via capacitors C1 and C2 to a common output terminal 10 which in turn is connected through a common load impedance $R_1$ to the reference ground. From terminal 10 appears an output from the driver circuit in the form of a positive going pulse with steep leading and trailing edges each time that a negative trigger pulse is applied to the circuit input. This circuit input is terminal 12 which is connected via capacitor C3 to both base electrodes. Capacitor C3 and resistor $R_2$ act as a differentiating circuit which transforms the leading and trailing edges of the input pulse into spikes of opposite polarity.

Since transistors TR1 and TR2 are of the PNP type, their collector electrodes are biased negative with respect to the base and emitter electrodes. The collector of TR1 is connected to a supply potential $V_C$ negative with respect to ground through a series circuit comprised of diode D1 and inductor L1 in the manner shown in FIGURE 1. The collector of TR2 is likewise connected to the same negative potential $V_C$ through a similar series circuit comprised of diode D3 and inductor L2. Each of the diodes D1 and D3 has its anode connected to the collector and its cathode connected to one terminal of the associated inductor. A diode D2 is connected in shunt across inductor L1 with its anode connected to the negative reference potential. In like fashion, a diode D4 is shunted across inductor L2 with its anode also connected to the negative reference potential.

Transistors TR1 and TR2 are of the type which exhibits a collector negative resistance characteristic upon application of a reverse collector potential which is equal to the avalanche breakdown potential of the collector-base diode junction. Avalanche breakdown of a reverse biased semiconductor diode junction may be generally defined as that phenomenon occurring when the electric field in the junction region becomes large enough so that the current carrying electrons acquire enough velocity to produce new carriers by removing valence electrons from their covalent bonds. These new carriers may, in turn, produce additional carriers again through the process of ionization by collision or otherwise. This cumulative process is referred to as avalanche multiplication and results in the flow of a large reverse current substantially independent of the collector voltage, which in turn normally decreases. This diode junction will recover when the magnitude of the reverse voltage is reduced below the breakdown voltage (see Vacuum-Tube and Semiconductor Electronics by J. Millman, McGraw-Hill [1958], page 118). The magnitude of the avalanche breakdown potential for the collector junction is dependent upon the magnitude and polarity of base current. For example, if a PNP transistor is operated so that conventional base current flows in the direction indicated in FIGURE 1, then the breakdown collector potential is lower than that required if no current flows in the base electrode. Therefore, by merely changing the value of base current, the transistor may or may not exhibit avalanche breakdown for some constant collector supply potential.

In FIGURE 1, the collector supply voltage $V_C$ is set slightly below the avalanche breakdown potential which would be required when the circuit is in its quiescent state, i.e., when there is no input trigger pulse. Therefore, the collector-base junction presents a high impedance to current flow therethrough. During this time, each of the capacitors C1 and C2 has applied thereacross a potential equal to the negative collector supply voltage $V_C$ connected to the terminals of the two inductors. Upon receipt of a negative voltage spike at terminal 12, a small amount of negative base current flows (in the order of 1–2 ma.) in the direction of the arrow which lowers the avalanche breakdown voltage point, such that each transistor is driven into its avalanche mode of operation. In this condition, the collector current substantially increases while the collector voltage rises toward reference ground. Consequently, each capacitor C1 and C2 discharges via a path consisting of its associated transistor and load resistor $R_1$. For example, when transistor TR1 is driven into its avalanche mode, conventional current flows from its collector to the left hand plate of capacitor C1 in the direction indicated by the solid arrow. Since the current is maximum at the beginning of this discharge cycle, an output pulse at terminal 10 is generated having an extremely fast rise time. The negative input signal is wide enough so that transistor TR1 and TR2 remains in its avalanche mode long enough to substantially discharge each of the capacitors. Thereafter, the collector-base junction of each again presents a relatively high impedance so that the collector potential returns to the negative $V_C$ connected to one terminal of the inductor. Thus, each capacitor recharges towards the negative collector supply potential $V_C$ through the path comprised of the common load impedance R1, the capacitor itself, and its associated diode and inductor series combination. For example, capacitor C1 commences to recharge through a path comprised of R1, C1, D1, and L1. The flow of conventional current during the recharge time is shown by the dotted line. By making the total resistance (R), capacitance (C), and inductance (L) values of this path such that $$\frac{R^2}{4L^2}<\frac{1}{LC}$$

a sudden change in externally applied E.M.F. across this path sets up current oscillations therein which are subsequently damped to a vanishing point. In the present case, this change in applied E.M.F. occurs when transistors TR1 and TR2 revert to their high resistance state so as to effectively connect $V_C$ across this recharge path. This phenomenon of current oscillation in a RLC series circuit is well known, being described for example in pages 565–571 of the book "Alternating Current Circuits 3rd ed." by Kerchner and Corcoran, published by John Wiley and Sons (1951) and herewith incorporated by reference. The frequence of oscillation is obtained from the equation $$\frac{1}{2\pi}\sqrt{\frac{1}{LC}-\frac{R^2}{4L^2}}$$

whereby it can be seen that said frequency becomes practically equal to the series L—C resonant frequency $$\frac{1}{2\pi\sqrt{LC}}$$

if $$\frac{R^2}{4L^2}$$

is small as compared with $$\frac{1}{LC}$$

This results in an extremely rapid recharging of capacitor C1 to its quiescent potential, as compared with the prior art where no inductor is utilized.

Due to the fact that the collector supply voltage $V_C$ is adjusted to a value slightly below the avalanche breakdown voltage (in the absence of a negative input trigger signal), it is necessary that the potential of the collector electrode never drop substantially below $V_C$ during the recovery time of the circuit. However, the presence of an inductor in the charging path would normally cause the potential across its associated capacitor to reach a value twice this magnitude, or $2V_C$. In order to clamp the collector side of capacitor C1 to $V_C$, diode D2 is inserted in shunt relationship with inductor L1, having its anode connected to $V_C$ terminal and its cathode to the other side of inductor L1. This arrangement prevents the collector electrode from dropping substantially below $V_C$ since the voltage across diode D2 remains relatively constant and extremely small. Therefore, the collector electrode of each transistor is clamped to a voltage no lower than the negative collector supply during the recharging recovery time.

Because of the resonant recharging path, the second half cycle of oscillation would normally result in capacitor C1 being discharged towards the opposite polarity by virtue of the energy stored in the electro-magnetic field of the inductor. To prevent current flow in the opposite direction within the recharging path, diode D1 is inserted with the polarity shown to inhibit the second half cycle of the resonant oscillation. Therefore, when a capacitor has been recharged to $V_C$ and there clamped by action of diode D2, subsequent discharging cannot occur between input signals because of the high impedance presented by the back biased series diode D1. In order for the capacitor to be discharged at some later time, therefore, transistor TR1 must again be driven into its avalanche mode in the manner previously described.

Figure 2:
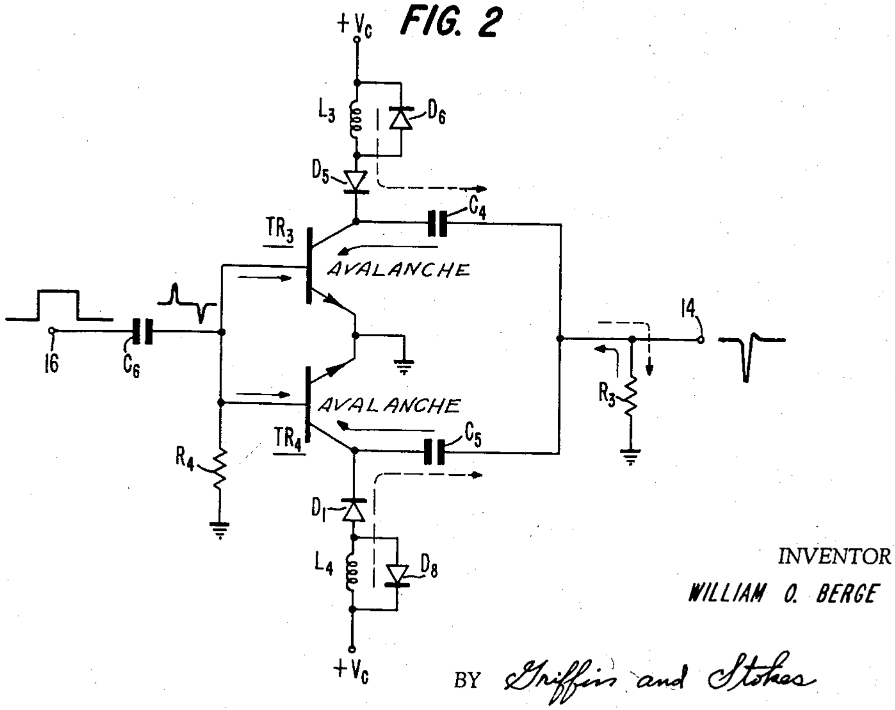
FIGURE 2 is a circuit schematic of an alternative embodiment of the present invention.

Although the values of the components shown in FIGURE 1 obviously depend upon the particular use to be made of the circuit, the following exemplary values are given by way of example, but are not to be construed as a limitation upon the invention thereof:

TR1 and TR2 are 2N705 transistors
$R1$=10 ohms
$R2$=47 ohms
$C1$ and $C2$=100 micromicrofarads
$C3$=0.1 microfarad
D1, D2, D3, D4 are T15 diodes
$L1$ and $L2$=2 microhenries
$V_C$=−15 volts FIGURE 2 discloses an alternative embodiment of the present invention wherein NPN transistors TR3 and TR4 are utilized. This circuit produces output pulses having a polarity opposite to that produced by the circuit in FIGURE 1. The arrangement of components in FIGURE 2 is exactly identical to the arrangement in FIGURE 1, with the exception that the polarity of diodes D5, D6, D7, and D8 are reversed in accordance with the direction of the charging path current as shown by the dotted lines. In addition, the collector biasing potential connected to the terminals of inductors L3 and L4 is now positive with respect to the reference potential ground, and a positive going input signal is employed to cause breakdown of the collector junction. A detailed description of the operation of FIGURE 2 is deemed unnecessary in view of the similarity between it and the operation of FIGURE 1.

An open end transmission line (commonly known as a width cable) may be substituted for each capacitor C1 and C2 (or C4 and C5) if a definite output pulse width or flat top pulse is desired. By so doing, the capacitance of the width cable is charged and discharged instead of the lumped capacitance of C1 and C2. This is an added feature of the circuit to give any desired width to the output pulse. Width may be varied by shortening or lengthening the width cable.

In place of a three electrode transistor such as shown in FIGURES 1 and 2, a junction breakdown diode exhibiting the avalanche effect may be used if it has a high enough reverse breakdown voltage to store sufficient energy in the capacitor. Unlike transistor breakdown, however, the diode voltage does not approach zero. Therefore, current through the diode might have to be limited to a lower value so that dissipation cannot damage the diode. Furthermore, as has before been stated, a negative resistance characteristic may be due to effects other than avalanche breakdown of a rectifying junction. Point contact transistors exhibit this characteristic and thus could be used as the switch in the capacitor circuit. Consequently, the present invention is not to be limited to the use of solid state devices in which avalanche breakdown occurs; although the preferred embodiments have been described as utilizing this effect.

What has been shown is a driver circuit utilizing at least one capacitor which is discharged by the negative resistance characteristic of an associated solid state switch, and is thereafter rapidly recharged during a recovery period by the first half cycle of a resonant oscillation. Many modifications and alterations thereto may be apparent to one skilled in the art without departing from the spirit of the invention as defined in the appended claims.

I claim:

1. A high speed driver circuit comprising: a semiconductor device including at least two electrodes between which is exhibited a negative resistance characteristic, a series combination of a capacitor and a resistor connected between one of said electrodes and a potential with an output terminal connected to the junction between said capacitor and said resistor, a potential connected to the other of said electrodes, an inductor for providing resonant oscillation in a series circuit including it and said capacitor, a potential connected through said inductor to said one electrode for reverse biasing said device to a high resistance condition, first means to apply a signal to said device for temporarily operating same in its negative resistance condition to provide current flow in one direction through said series combination, second means to thereafter limit current flow through said capacitor and said inductor to the first half cycle of resonant oscillation, and third means to clamp the voltage across said capacitor to a value which prevents operation of said device in its negative resistance condition in the absence of first means actuation.

2. A circuit according to claim 1 wherein said second means is a diode connected in series with said inductor.

3. A circuit according to claim 1 wherein said third means is a diode connected in parallel with said inductor.

4. A circuit according to claim 1 wherein said second means is a diode connected in series with said inductor, while said third means is a diode connected in parallel with said inductor.

5. A circuit according to claim 1 wherein said negative resistance condition of said device is due to avalanche breakdown therein.

6. A circuit according to claim 5 wherein said second means is a diode connected in series with said inductor, while said third means is a diode connected in parallel with said inductor.

7. A high speed driver circuit comprising: a semiconductor device including base, emitter, and collector electrodes which has a negative resistance characteristic, a series combination of a capacitor and a resistor connected between said collector electrode and a potential with an output terminal connected to the junction between said capacitor and said resistor, a potential connected to said emitter electrode, an inductor for providing resonant oscillation in a series circuit including it and said capacitor, a potential connected through said inductor to said collector electrode for reverse biasing said device to a high resistance condition, first means for applying a signal to said base electrode to temporarily operate said device in its negative resistance condition to provide current flow in one direction through said series combination, second means to thereafter limit current flow through said capacitor and said inductor to the first half cycle of resonant oscillation, and third means to clamp the voltage across said capacitor to a value which prevents operation of said device in its negative resistance condition in the absence of first means actuation.

8. A circuit according to claim 7 wherein said second means is a diode connected in series with said inductor.

9. A circuit according to claim 7 wherein said third means is a diode connected in parallel with said inductor.

10. A circuit according to claim 7 wherein said second means is a diode connected in series with said inductor, while said third means is a diode connected in parallel with said inductor.

11. A circuit according to claim 7 wherein said semiconductor device is a PNP transistor whose negative resistance characteristic is due to avalanche breakdown of the collector base junction therein.

12. A circuit according to claim 11 wherein said second means is a diode connected in series with said inductor, while said third means is a diode connected in parallel with said inductor.

13. A circuit according to claim 7 wherein said semiconductor device is a NPN transistor whose negative resistance characteristic is due to avalanche breakdown of the collector base junction therein.

14. A circuit according to claim 13 wherein said second means is a diode connected in series with said inductor, while said third means is a diode connected in parallel with said inductor.

15. A high speed driver circuit comprising: a plurality of semiconductor devices each including base, emitter, and collector electrodes which has a negative resistance characteristic, a common load resistor one terminal of which is connected to a potential, a plurality of capacitors connected one between the collector electrode of a semiconductor device and the other terminal of said common load resistor, a potential connected to said emitter electrodes, a plurality of inductors each for providing resonant oscillation in a series circuit including it and an individual one of said capacitors, a potential connected through a respective one of said inductors to the collector electrode of a respective one of said devices for reverse biasing said device to a high resistance condition, first means for simultaneously applying a signal to the base electrode of each semiconductor device to temporarily operate said device in its negative resistance condition to provide current flow in one direction through its associated capacitor and said common resistor, a plurality of second means associated one with each of said semiconductor devices to thereafter limit current flow through an associated capacitor and inductor to the first half cycle of resonant oscillation, and a plurality of third means associated one with each of said semiconductor devices for clamping the voltage on an associated capacitor to a value which prevents operation of said device in its negative resistance condition in the absence of first means actuation.

16. A circuit according to claim 15 wherein each said second means is a diode connected in series with its associated inductor.

17. A circuit according to claim 15 where each said third means is a diode connected in parallel with its associated inductor.

18. A circuit according to claim 15 wherein each said semiconductor device is a PNP transistor whose negative resistance characteristic is due to avalanche breakdown of the collector base junction therein.

19. A circuit according to claim 18 wherein each said second means is a diode connected in series with its associated inductor, while each said third means is a diode connected in parallel with its associated inductor.

20. A circuit according to claim 15 wherein each said semiconductor device is a NPN transistor whose negative resistance characteristic is due to avalanche breakdown of the collector base junction therein.

21. A circuit according to claim 20 wherein each said second means is a diode connected in series with its associated inductor, while each said third means is a diode connected in parallel with its associated inductor.

References Cited in the file of this patent

UNITED STATES PATENTS

| | | |
|---|---|---|
| 2,849,626 | Klapp | Aug. 26, 1958 |
| 2,995,709 | Beardwood et al. | Aug. 8, 1961 |